United States Patent [19]
Mehr et al.

[11] Patent Number: 5,936,848
[45] Date of Patent: Aug. 10, 1999

[54] ELECTRONICS PACKAGE THAT HAS A SUBSTRATE WITH AN ARRAY OF HOLLOW VIAS AND SOLDER BALLS THAT ARE ECCENTRICALLY LOCATED ON THE VIAS

[75] Inventors: Behrooz Mehr, Palo Alto, Calif.; Tony Kean-Lee Lim; Agnes Seok-Tuan Lim, both of Penang, Malaysia; Michael Barrow, El Dorado Hills, Calif.

[73] Assignee: Intel Corporation, Santa Clara, Calif.

[21] Appl. No.: 09/087,793

[22] Filed: May 29, 1998

Related U.S. Application Data

[63] Continuation-in-part of application No. 08/832,482, Apr. 2, 1997, Pat. No. 5,875,102, which is a continuation-in-part of application No. 08/603,444, Feb. 20, 1996, Pat. No. 5,706,178, which is a continuation-in-part of application No. 08/575,917, Dec. 20, 1995, Pat. No. 5,796,589.

[51] Int. Cl.$^6$ ...................................................... H05K 7/02
[52] U.S. Cl. ......................... 361/777; 361/774; 361/760; 361/772; 361/783; 361/779; 174/260-265; 228/180.21; 228/180.22; 257/692; 257/698; 257/774; 257/723; 257/724; 257/737; 257/738
[58] Field of Search ...................................... 361/777, 774, 361/760, 772, 783, 779; 174/260–265; 257/692, 698, 723, 724, 738, 735, 774, 778, 779, 786; 228/180.21, 180.22

[56] References Cited

U.S. PATENT DOCUMENTS

| | | | |
|---|---|---|---|
| 5,239,198 | 8/1993 | Lin et al. | 257/693 |
| 5,504,277 | 4/1996 | Danner | 174/261 |
| 5,591,941 | 1/1997 | Accocella et al. | 174/266 |
| 5,640,047 | 6/1997 | Nakashima | 257/738 |
| 5,764,485 | 6/1998 | Lebaschi | 361/774 |
| 5,796,163 | 8/1998 | Glenn et al. | 257/698 |

*Primary Examiner*—Leo P. Picard
*Assistant Examiner*—David Foster
*Attorney, Agent, or Firm*—Blakely, Sokoloff, Taylor & Zafman

[57] ABSTRACT

An electronics package includes a substrate, a via and a solder ball. The substrate has first and second opposed surfaces. The via is located within the substrate and terminates at the first surface. The via defines an opening having first and second opposed walls. The solder ball is at least partially located over the opening. The solder ball has first and second opposed sides, the first side being adjacent the first wall and the second side being adjacent the second wall. The first side is nearer to the first wall than the second side is to the second wall.

17 Claims, 2 Drawing Sheets

ELECTRONICS PACKAGE THAT HAS A SUBSTRATE WITH AN ARRAY OF HOLLOW VIAS AND SOLDER BALLS THAT ARE ECCENTRICALLY LOCATED ON THE VIAS

BACKGROUND OF THE INVENTION

This Patent Application is a Continuation-In-Part of patent application Ser. No. 08/832,482 filed on Apr. 2, 1997 now U.S. Pat. No. 5,875,102, which is a Continuation-In-Part of patent application Ser. No. 08/603,444 now U.S. Pat. No. 5,706,178 filed on Feb. 20, 1996, which is a Continuation-In-Part of patent application Ser. No. 08/575,917 now U.S. Pat. No. 5,796,589 filed on Dec. 20, 1995.

1.) Field of the Invention

This invention relates to an electronics package and, more particularly, to an electronics package of the kind which is mounted to a printed circuit board by means of a ball grid array.

2.) Discussion of Related Art

An integrated circuit package usually includes a substrate and a semiconductor chip located on a first side of the substrate. The integrated circuit houses a circuit which is connected by means of electrical lines or the like to conductive pads at various locations on the first side of the substrate. Vias then extend from the conductive pads through the substrate to a second, opposing side of the substrate. Solder balls are located in an array on the second side and make electrical contact with the vias. The integrated circuit is so electrically connected to the solder balls.

The integrated circuit package may then be located on a printed circuit board having a plurality of bond pads making contact with the solder balls. The integrated circuit package and the printed circuit board are heated to reflow the solder balls and connect the solder balls and the bond pads.

FIG. 1 of the accompanying drawings shows a portion of such a substrate 1 and a solder ball 2. A hollow via 3 extends through the substrate 1. Bonding wires and traces (not shown) extend from an integrated circuit and make contact with a conductive pad 5 in contact with the via. The solder ball 2 is located on another conductive pad 6 on an opposing side of the via 3. A solder mask 7 covers one end of a channel 8 extending through the via 3. The solder ball 2 covers an opposing end of the channel 8. FIG. 1 therefore shows a via-in-pad arrangement such as described in U.S. patent application Ser. No. 08/575,917 which is assigned to the same assignee as the present invention.

The solder ball 2 is attached by heating the arrangement of FIG. 1, causing reflow of the solder ball, and then allowing the solder ball 2 to cool down. A certain amount of moisture is trapped within the solder mask 7. The moisture evaporates during heating causing vapor to build up. The vapor creates a pressure on the solder ball 2. Since the ball 2 seals fairly tightly on the conductive pad 6, the pressure within the channel 8 tends to build up fairly highly. Once a high enough pressure is reached, the gasses rupture the solder ball 2, causing major damage to the solder ball 2. The gasses tend to break through the solder ball at various locations, but typically break through the solder ball 2 at a location where the solder ball 2 attaches to the bond pad on the printed circuit board. These ruptures may cause failure in electrical connection between the solder ball 2 and the printed circuit board.

SUMMARY OF THE INVENTION

An electronics package includes a substrate, a via and a solder ball. The substrate has first and second opposed surfaces. The via is located within the substrate and terminates at the first surface. The via defines an opening. The solder ball is at least partially located over the opening. The solder ball has a center line which is off center with respect to a center line of the via.

BRIEF DESCRIPTION OF THE DRAWINGS

The invention is further described by way of example with reference to the accompanying drawings wherein.

DESCRIPTION OF PREFERRED EMBODIMENT

Figure 2:
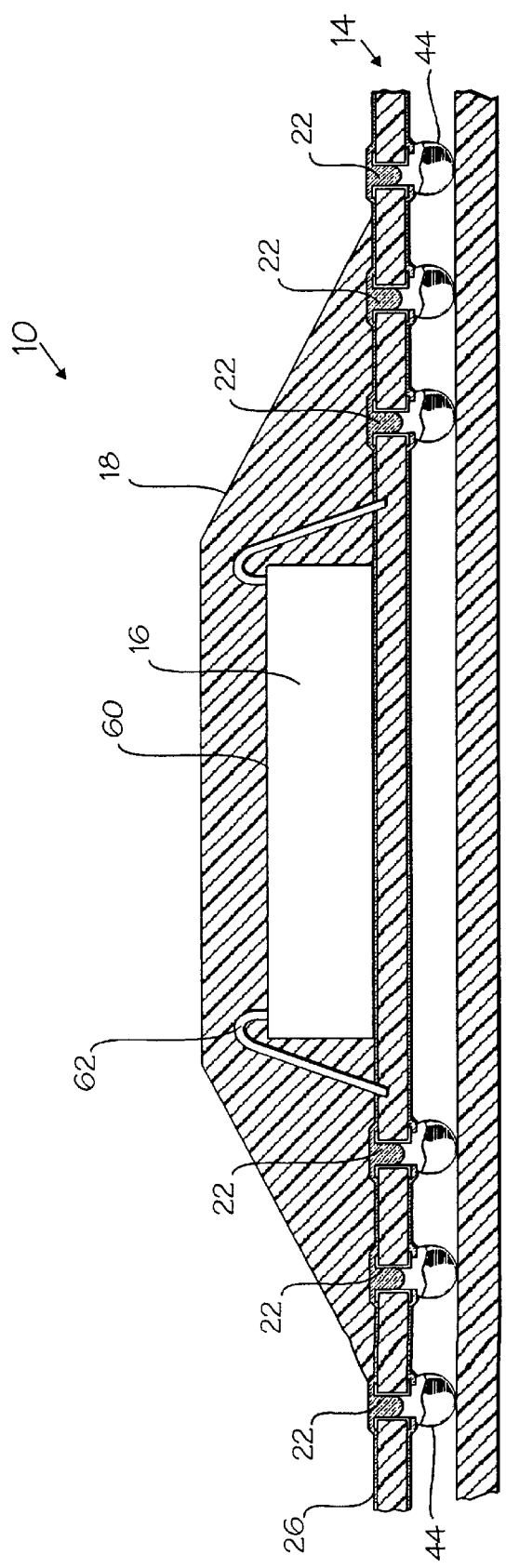
FIG. 2 is a cross-sectional view of an integrated circuit package according to the invention.

FIG. 2 of the accompanying drawings shows an integrated circuit package 10 which is located on a printed circuit board 12. The integrated circuit package 10 includes a substrate 14, an integrated circuit 16 located on the substrate, and an encapsulant 18 over the integrated circuit 16.

Figure 1:
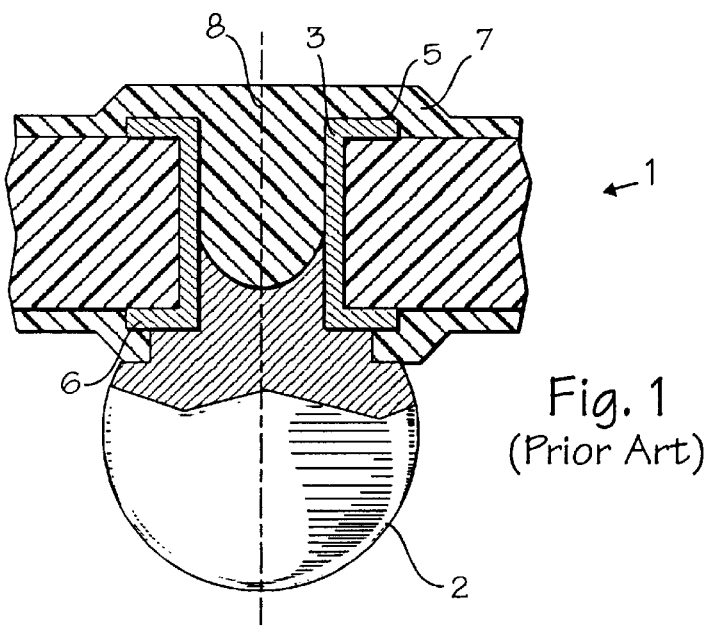
FIG. 1 is a cross-sectional view of a portion of a conventional electronics package.
Figure 3:
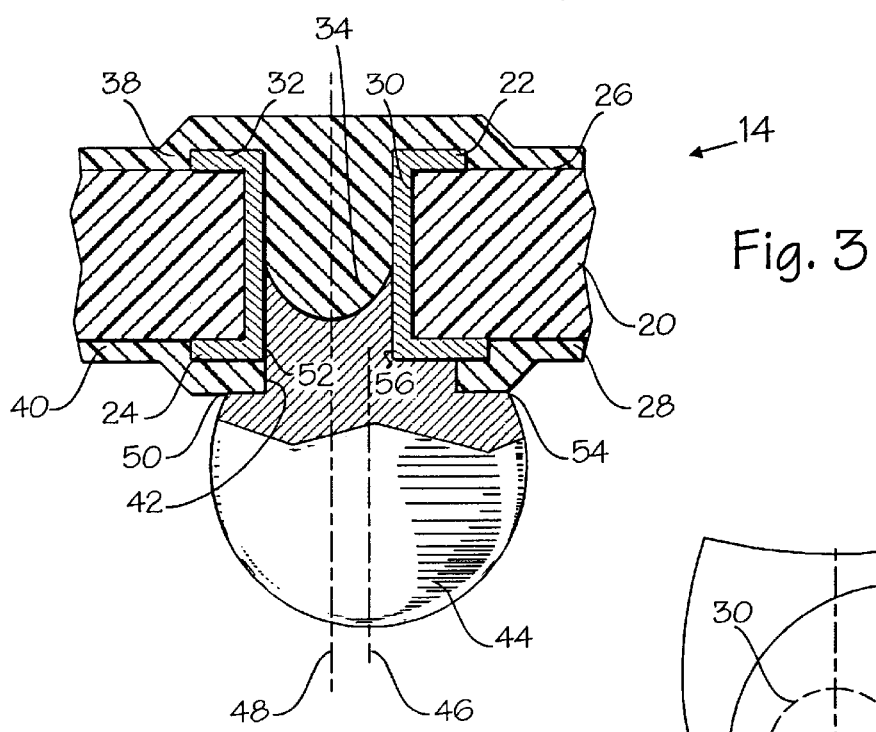
FIG. 3 is a cross-sectional view of a portion of the integrated circuit package of FIG. 2

Referring to FIG. 3, the substrate 14 includes a core 20 of a dielectric material such as a flexible polyimide or a rigid epoxy. Conductive pads 22 and 24 are formed in arrays on first and second opposing surfaces 26 and 28, respectively, of the core 20. Holes 30 are then drilled from one of the surfaces through the core 20 with each hole 30 extending through one conductive pad 22 on the first surface 26 and another conductive pad 24 on the second surface 28. A via 32 is then deposited, utilizing known deposition processes, on an inner surface of each hole 30 so that the via 32 electrically connects the respective conductive pads 22 and 24. Depositing of the via 32 only partially fills the hole 30 so that a channel 34 is defined through the via 32.

The first and second surfaces 26 and 28 are then covered with solder masks 38 and 40, respectively.

The solder mask 38 on the first surface 26 covers the conductive pad 22 and the channel 34. The solder mask 38 only partially fills the channel 34.

The solder mask 40 on the second surface has an aperture 42 over the conductive pad 24 so that the solder mask 40 is partially located on the conductive pad 24.

A solder ball 44 is located on the conductive pad 24 on the second surface 28. The solder ball 44 fills the rest of the channel 34. The solder ball 44 has a center line 46 which is off center from a center line 48 of the channel 34. By so locating the solder ball 44 off center with the channel 34, the solder ball 44 has a first side 50 adjacent a first wall 52 of the channel, and a second side 54 adjacent a second wall 56 of the channel 34, wherein the first side 50 is nearer the first wall 52 than the second side 54 is to the second wall 56. Although the solder ball 44 is shown as completely covering the channel 34, it should be understood that the solder ball 44 may only partially cover the channel 34.

The solder ball 44 is located partially off the conductive pad 24. The solder mask 40 however prevents the solder ball 44 from making contact with the second surface 28, and therefore from shorting with traces (not shown) which may exist on the second surface 28.

Figure 4:
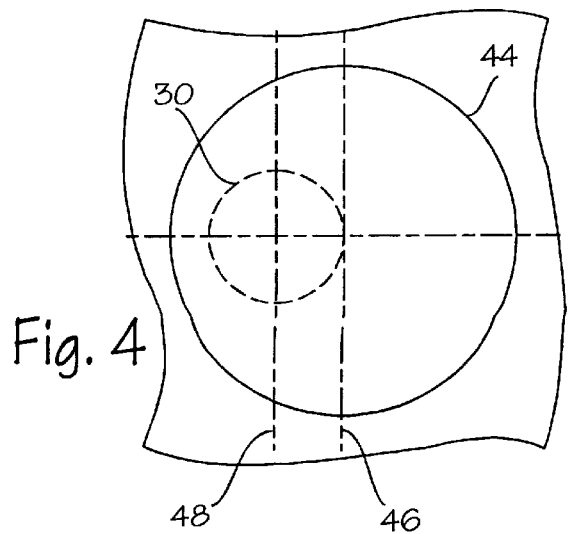
FIG. 4 is a view from below of a portion of the integrated circuit.

FIG. 4 shows the structure of FIG. 3 from below and illustrates that the ball 44 is located off center from the via 30.

The solder ball 44 is attached to the conductive pad 24 at an elevated temperature. A certain amount of moisture is trapped within the solder mask 38. An elevated temperature causes the moisture to evaporate causing vapor to build up. The vapor creates a pressure on the solder ball 44. The vapor will choose the path of least resistance in order to escape. Since the first side 50 of the solder ball 44 is relatively close to the first wall 52 of the channel 34, the vapor creates a small opening extending from the first wall 52 to the first side 50, and escapes through the small opening. By locating the solder ball 44 off center with respect to the channel 34, major damage to the solder ball 44 is thereby prevented. Moreover, the solder ball 44 does not rupture in an area where the solder ball 44 attaches to the bond pads on the printed circuit board 12.

Referring again to FIG. 2, the integrated circuit 16 is located on the solder mask 38 on the first surface 26. A circuit (not shown) is located in a side 60 of the integrated circuit 16 opposing the substrate 14. Bonding wires 62 are attached to traces (not shown) leading to the circuit, extend through the solder mask 38 and are connected to the respective conductive pads 22 on the first surface 26. The circuit is thereby placed in electrical communication with the respective solder balls 44. Although bonding wires 62 are shown, it should be understood that the integrated circuit may also be connected by other means such as tape automated bonding (TAB) tape or with solder bumps in a process commonly referred to as controlled collapse chip connect (C4).

The encapsulant 18 encloses the integrated circuit 16 and the bonding wires 62 for purposes of protection, and may be made of an epoxy or a plastic molded after the integrated circuit 16 is located on the substrate 14.

The integrated circuit package is then located on the printed circuit board 12 with each solder ball 44 making contact on a respective bond pad (not shown) on the printed circuit board 12.

The solder balls 44 are attached to the bond pads by heating the integrated circuit package 10 and the printed circuit board through a reflow process in a furnace, causing the solder balls 44 to flow into contact with the bond pads. The integrated circuit package 10 is then allowed to cool which causes the solder balls 44 to stall in location and finalize assembly of the integrated circuit package 10.

While certain exemplary embodiments have been described and shown in the accompanying drawings, it will be understood that such embodiments are merely illustrative of and not restrictive of the broad invention, and to that the invention not be limited to the specific constructions and arrangements shown and described since various other modifications may occur to those ordinarily skilled in the art.

What is claimed:

1. An electronic package which includes:

a substrate having first and second opposed surfaces;

a via within the substrate and terminating at a first surface, the via defining an opening; and a solder ball at least partially located over the opening, the solder ball having a center line which is off center with respect to a center line of the via.

2. The electronic package of claim 1 wherein the solder ball covers the entire opening.

3. The electronic package of claim 1 wherein the opening terminates against the solder ball.

4. The electronic package of claim 1 which includes a conductive pad on the first surface of the substrate and in contact with the via, the opening extending through the conductive pad and the solder ball being located on the conductive pad.

5. The electronic package of claim 4 which includes a solder mask located on the first surface of the substrate and extending onto the conductive pad on the first surface.

6. The electronic package of claim 1 which includes a conductive pad on the second surface and in contact with the via.

7. The electronic package of claim 6 which includes a solder mask located on the second surface and extending onto the conductive pad on the second surface.

8. An electronic package which includes:

a substrate having first and second opposed surfaces, a via within the substrate and terminating at the first surface, the via defining an opening having first and second opposed walls; and a solder ball at least partially located over the opening, the solder ball having first and second opposed sides, the first side being adjacent the first wall and the second side being adjacent the second wall, with the first side being nearer to the first wall than the second side is to the second wall.

9. An integrated circuit package which includes:

a substrate having first and second opposed surfaces;

a via within the substrate and terminating at the first surface, a solder ball at least partially located over the opening, the solder ball having a center line which is off center with respect to a center line of the via; and an integrated circuit located on the second side, the integrated circuit containing a circuit which is electrically connected to the via.

10. The integrated circuit package of claim 9 wherein the solder ball covers the entire opening.

11. The integrated circuit package of claim 9 wherein the opening terminates against the solder ball.

12. The integrated circuit package of claim 9 which includes a conductive pad on the first surface and in contact with the via, the opening extending through the conductive pad and the solder ball being located on the conductive pad.

13. The integrated circuit package of claim 12 which includes a solder mask located on the first surface and extending onto the conductive pad on the first surface.

14. The integrated circuit package of claim 9 which includes a conductive pad on the second surface and in contact with the via.

15. The integrated circuit package of claim 14 which includes a solder mask located on the second surface and extending onto the conductive pad on the second surface.

16. The integrated circuit package of claim 10 which includes an encapsulant that encloses the integrated circuit.

17. A method of constructing an electronic package, which includes the steps of:

forming a via within a substrate with the via defining an opening having fist and second opposed walls; and locating a solder ball at least partially over the opening, the solder ball having a center line which is off center with respect to a center line of the via.

* * * * *